(12) United States Patent
Higashinaka (10) Patent No.: US 12,003,321 B2
(45) Date of Patent: Jun. 4, 2024

(54) WIRELESS COMMUNICATION SYSTEM, WIRELESS COMMUNICATION DEVICE, RECEIVER, CONTROL CIRCUIT, AND STORAGE MEDIUM

(71) Applicant: MITSUBISHI ELECTRIC CORPORATION, Tokyo (JP)

(72) Inventor: Masatsugu Higashinaka, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 320 days.

(21) Appl. No.: 17/372,890

(22) Filed: Jul. 12, 2021

(65) Prior Publication Data

US 2021/0344443 A1 Nov. 4, 2021

Related U.S. Application Data

(63) Continuation of application No. PCT/JP2019/006879, filed on Feb. 22, 2019.

(51) Int. Cl.
    *H04B 1/38* (2015.01)
    *H03M 13/19* (2006.01)
    *H04L 1/00* (2006.01)

(52) U.S. Cl.
    CPC .......... *H04L 1/0041* (2013.01); *H03M 13/19* (2013.01); *H04L 1/0045* (2013.01); *H04L 1/0059* (2013.01)

(58) Field of Classification Search
    CPC ... H04L 1/0041; H04L 1/0045; H04L 1/0059; H04L 1/0054; H04L 1/006; H04L 1/0068;
    (Continued)

(56) References Cited

U.S. PATENT DOCUMENTS

2005/0254605 A1* 11/2005 Holmes ............. H03M 13/3988
                                                                714/795
2009/0063929 A1*  3/2009 Jeong ..................... H04L 27/38
                                                                714/752

FOREIGN PATENT DOCUMENTS

CN      1482803 A       3/2004
EP      2 297 858 B1    11/2011
(Continued)

OTHER PUBLICATIONS

European Office Action issued in corresponding European Application No. 19916018.5 dated Oct. 13, 2022.

(Continued)

*Primary Examiner* — Tuan Pham
(74) *Attorney, Agent, or Firm* — BIRCH, STEWART, KOLASCH & BIRCH, LLP (57) ABSTRACT

A system includes: a transmitter including: a coding unit generating a first bit sequence by convolutional coding on information bits based on a code rate; a bit erasing unit generating a second bit sequence by erasing one or more bits from the first bit sequence for every predetermined first number of bits; and a modulation unit generating a symbol by modulation using the second bit sequence; and a receiver including: a demodulation unit calculating first reliabilities that can be derived from the symbol; a likelihood extension unit generating extended bit sequences each composed of bits for the first number of bits, and generating a plurality of second reliabilities by assigning first reliabilities duplicated, as the reliabilities of the extended bit sequences; and a decoding unit creating a trellis diagram using the code rate and the extended bit sequences, and assigning the second reliabilities to branches of the trellis diagram.

13 Claims, 8 Drawing Sheets

(58) Field of Classification Search
CPC ............ H03M 13/19; H03M 13/6325; H03M 13/6362; H03M 13/256
See application file for complete search history.

(56) References Cited

FOREIGN PATENT DOCUMENTS

JP           5586504 B2     9/2014
WO    WO 2015/183188 A1    12/2015

OTHER PUBLICATIONS

Indian Office Action dated Mar. 14, 2022 in corresponding Indian Patent Application No. 202147031711 with English Translation.
European Search Report dated Jan. 19, 2022 in corresponding European Application No. 19916018.5.
Notification of Reasons for Refusal for Japanese Application No. 2019-536247, dated Jul. 30, 2019.
Yoshikazu Nishimura, "Fundamentals of Data Cording Technology and Error", CQ Publishing Co., Ltd., First Edition, Aug. 1, 2010, pp. 139-172, in particular, Section 9.10 and 9.11.
Indian Office Action for Indian Application No. 202147031711, dated Mar. 7, 2024, with English translation.

* cited by examiner

WIRELESS COMMUNICATION SYSTEM, WIRELESS COMMUNICATION DEVICE, RECEIVER, CONTROL CIRCUIT, AND STORAGE MEDIUM

CROSS-REFERENCE TO RELATED APPLICATION

This application is a continuation application of International Application PCT/JP2019/006879, filed on Feb. 22, 2019, and designating the U.S., the entire contents of which are incorporated herein by reference.

BACKGROUND OF THE INVENTION

1. Field of the Invention

The present disclosure relates to a wireless communication system that performs decoding using a trellis diagram, a wireless communication device, a transmitter, and a receiver, which are associated therewith, and also relates to a control circuit and a storage medium.

2. Description of the Related Art

In recent years, a terminal has been adapted to control a device that is installed remotely from the terminal or collect data for a device that is installed remotely from the terminal. In order to perform these control and data collection, a sensor network using wireless communication or machine-to-machine (M2M) communication using wireless communication has become widespread. In the sensor network or M2M communication, it is desirable that terminals establishing wireless communication be able to communicate with each other over a long distance in terms of cost and flexibility of network construction.

The implementation of the long-distance wireless communication requires the use of a communication system with good sensitivity performance by which even weak radio waves attenuated by long-distance propagation can be received. An example of the communication system with good sensitivity performance is an orthogonal frequency shift keying (FSK) system. The orthogonal FSK system is a system that modulates a signal by allocating data to carriers that have their respective different frequencies and are orthogonal to each other. Moreover, in order to implement the long-distance wireless communication, it is desirable that data be error correction coded and transmitted such that incorrect data can be corrected even when an error occurs in the data due to a long propagation path. The error correction coded data is decoded by a decoder included in a receiver. Patent Literature 1 (Japanese Patent No. 5586504) discloses a decoder for decoding data that is subjected to convolutional coding as error correction coding and modulated by an M-value FSK system. The character "M" represents a modulation level.

The decoder described in Patent Literature 1 uses the modulation level M and a code rate R of the convolutional code to calculate a common multiple C of the number of bits per symbol, $\log_2 M$, and the reciprocal of the code rate R, 1/R. The decoder described in Patent Literature 1 performs decoding using a trellis diagram constructed such that the number of coded bits per branch is equal to the common multiple C. In this decoding, the decoder described in Patent Literature 1 can perform decoding using the likelihood per symbol even if the likelihood per bit cannot be calculated accurately as in the case of the signal modulated by the M-value FSK system.

However, the decoder described in Patent Literature 1 needs to use the trellis diagram constructed such that the number of coded bits per branch in the trellis diagram is equal to the common multiple C of the number of bits per symbol and the reciprocal of the code rate. For this reason, for example, when the reciprocal 1/R of the code rate R is not a natural number such as in the case of the code rate R=3/4, the decoder described in Patent Literature 1 cannot be used. Therefore, when the decoder described in Patent Literature 1 is used, the code rate of the convolutional code has some restriction. Since restriction is caused in the code rate, the use of the decoder described in Patent Literature 1 has leaded to a problem that the transmission speed cannot be set flexibly.

The present disclosure has been made in view of the above circumstances, and an object of the present disclosure is to provide a wireless communication system in which the transmission speed can be set flexibly.

SUMMARY OF THE INVENTION

In order to solve the above-mentioned problems and achieve the object, the present disclosure provides a wireless communication system comprising: a transmitter comprising: a coder to generate a first bit sequence by performing convolutional coding on an information bit on the basis of a code rate; a bit eraser to generate a second bit sequence by erasing one or more bits from the first bit sequence for every predetermined first number of bits; and a modulator to generate a symbol by modulation using the second bit sequence; and a receiver comprising: a demodulator to calculate a plurality of first reliabilities that are reliabilities of a plurality of bit sequences that can be derived from the symbol; a likelihood extender to generate a plurality of extended bit sequences that are bit sequences each composed of bits for the first number of bits, and generate a plurality of second reliabilities that are reliabilities of the plurality of extended bit sequences by assigning a plurality of first reliabilities duplicated, as the reliabilities of the plurality of extended bit sequences; and a decoder to create a trellis diagram using the code rate and the plurality of extended bit sequences, and perform decoding by assigning the plurality of second reliabilities to a plurality of branches of the trellis diagram.

DETAILED DESCRIPTION OF THE PREFERRED EMBODIMENTS

A wireless communication system, a wireless communication device, a transmitter, and a receiver according to an embodiment of the present disclosure will now be described in detail with reference to the drawings.

Embodiment

Figure 1:
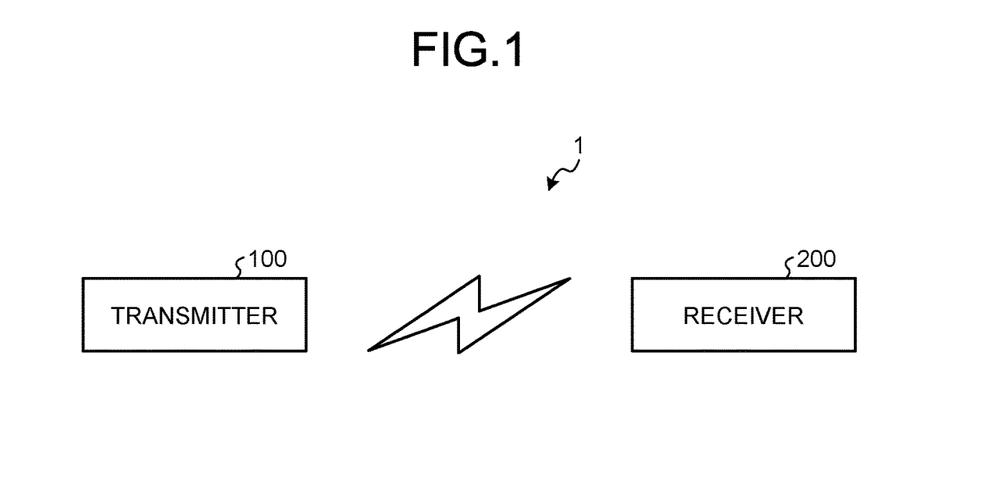
FIG. 1 is a diagram illustrating a configuration of a wireless communication system according to an embodiment.

FIG. 1 is a diagram illustrating a configuration of a wireless communication system according to an embodiment. A wireless communication system 1 includes a transmitter 100 and a receiver 200. The transmitter 100 and the receiver 200 perform wireless communication. The transmitter 100 performs convolutional coding on data, modulates the convolutionally coded data, and transmits the data obtained by the modulation to the receiver 200. The receiver 200 receives the data transmitted from the transmitter 100. Note that in the present embodiment, the wireless communication system 1 includes the transmitter 100 and the receiver 200, but a wireless communication device may include the transmitter 100 and the receiver 200.

Figure 2:
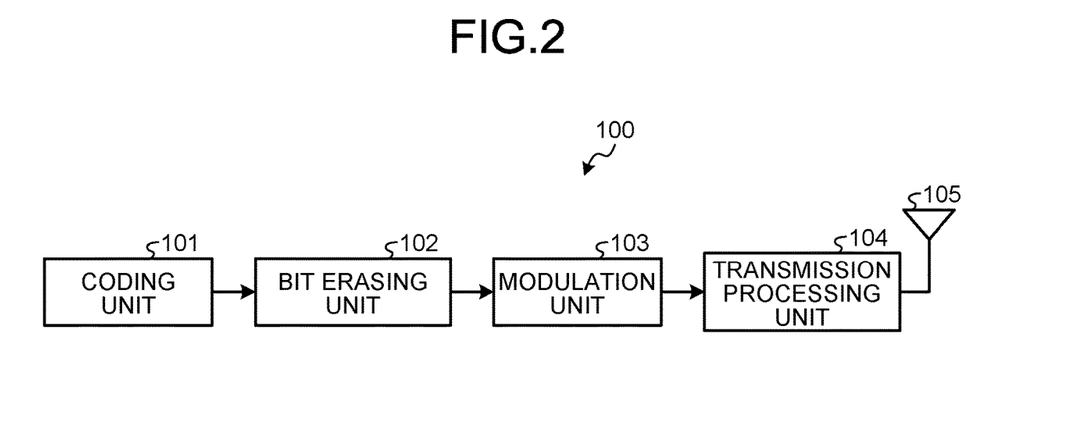
FIG. 2 is a diagram illustrating a configuration of a transmitter according to the embodiment.

FIG. 2 is a diagram illustrating a configuration of the transmitter 100 according to the embodiment. The transmitter 100 includes a coding unit or coder 101, a bit erasing unit or eraser 102, a modulation unit or modulator 103, a transmission processing unit or processor 104, and a transmitting antenna 105.

The coding unit 101 generates a first bit sequence by performing convolutional coding on information bits on the basis of a predetermined code rate. The coding unit 101 also outputs the first bit sequence to the bit erasing unit 102. The present embodiment is described for use of a convolutional code whose constraint length is three and whose code rate is R=1/2, as a specific example of the convolutional code. Since the code rate is R=1/2, the coding unit 101 outputs a coded bit sequence of two bits per bit of the information bits.

The bit erasing unit 102 generates a second bit sequence by erasing one or more bits from the first bit sequence for every consecutive first number of bits that is determined in advance, and outputs the second bit sequence to the modulation unit 103. The bit erasing unit 102 periodically erases the bits or bit to thereby convert the first bit sequence into the second bit sequence with a new code rate V higher than the code rate R used in the coding unit 101. For example, the bit erasing unit 102 erases one bit from the first bit sequence having four consecutive bits and outputs the second bit sequence, thereby converting the first bit sequence with the code rate of R=1/2 into the second bit sequence with the code rate of V=2/3. When a coded bit sequence of four consecutive bits is represented as [a, b, c, d], the bit erasing unit 102 erases the third bit "c" from [a, b, c, d] and outputs three bits that is [a, b, d] to the modulation unit 103. By periodically erasing a bit at a predetermined position within one cycle of the coded bit sequence, the data transmission efficiency per unit time and unit frequency can be increased as compared to a case of not erasing a bit. The first bit sequence is a bit sequence for one cycle, and is the bit sequence represented by [a, b, c, d] in the case of the above specific example. The second bit sequence is a bit sequence for one cycle obtained by erasing one or more bits from the first bit sequence, and is the bit sequence represented by [a, b, d] in the case of the above specific example. The coded bit sequence is a coded bit sequence composed of bits having the first number of bits.

The modulation unit 103 uses one or more of the second bit sequences to perform modulation processing using orthogonal signals, and generates a symbol. One example will be described in which one symbol generated by the modulation unit 103 is generated from the second bit sequence for one cycle. When the second bit sequence is represented by [a, b, d], one symbol generated by the modulation unit 103 is a symbol indicating [a, b, d]. An example of the modulation processing using orthogonal signals performed by the modulation unit 103 includes modulation processing using orthogonal 8FSK that uses eight signals that have different frequencies and are orthogonal to one another. The modulation unit 103 determines in advance eight combinations serving as associations between eight bit patterns derivable from the three bits making up the second bit sequence and the eight orthogonal signals having different frequencies, each of which is set as a one-to-one combination of a bit pattern and a frequency signal. Moreover, the modulation unit 103 uses the eight combinations thus determined in advance to select a frequency signal corresponding to a bit pattern of the second bit sequence inputted to the unit 103, and outputs the selected frequency signal to the transmission processing unit 104. The number of bits transmitted by one symbol generated by the modulation unit 103 is three bits making up the second bit sequence, or in other words, three bits that is equal to the number of bits of a predetermined cycle.

Figure 3:
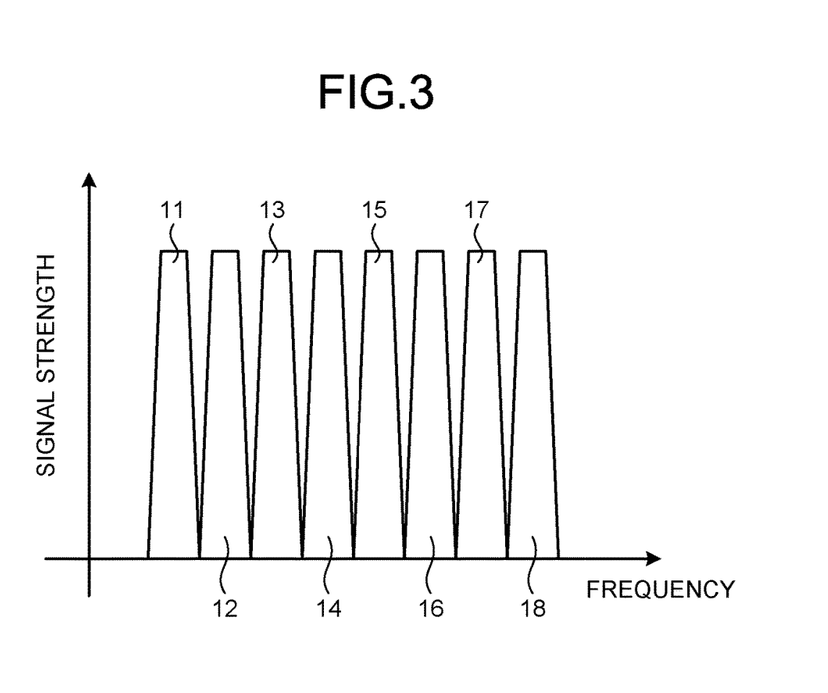
FIG. 3 is a graph illustrating signals having different frequencies in a frequency domain, the signals being associated with a second bit sequence by a modulation unit according to the embodiment.

FIG. 3 is a graph illustrating signals having different frequencies in the frequency domain, the signals each being associated with the second bit sequence by the modulation unit 103 according to the embodiment. In FIG. 3, the horizontal axis represents frequency, and the vertical axis represents signal strength. Signals 11 to 18 are signals that have their respective different frequencies and are orthogonal to one another. For example, the modulation unit 103 associates a bit sequence [0, 0, 0] with the signal 11. The modulation unit 103 further associates a bit sequence [0, 0, 1] with the signal 12. Similarly, the modulation unit 103 associates bit sequences [0, 1, 0], [0, 1, 1], [1, 0, 0], [1, 0, 1], [1, 1, 0], and [1, 1, 1] with the signals 13 to 18, respectively. Moreover, the modulation unit 103 outputs any one of the signals 11 to 18 corresponding to the bit pattern of the second bit sequence inputted to the unit 103 to the transmission processing unit 104. The symbol generated by the modulation unit 103 is any one of the signals 11 to 18.

A description will be made of processing performed by the transmitter 100 for two cycles when a process of generating any one of the signals 11 to 18 is set as one cycle. As described above, the bit erasing unit 102 outputs, to the modulation unit 103, three bits obtained by erasing one bit from four bits inputted therein. The bit erasing unit 102 performs this processing periodically on consecutive first bit sequences. The modulation unit 103 associates the three-bit signal periodically outputted from the bit erasing unit 102 with any one of the signals 11 to 18. For example, a case is assumed in which two first bit sequences [a, b, c, d, e, f, g, h] of eight bits are obtained from the coding unit 101, and then two second bit sequences of [a, b, d, e, f, h] are generated by periodically erasing bits therefrom in the bit erasing unit 102. This processing by the bit erasing unit 102 corresponds to two cycles of the process of erasing a bit, performed by the bit erasing unit 102. At this time, the modulation unit 103 selects any one of the signals 11 to 18 corresponding to [a, b, d] that corresponds to the processing result for the first cycle, and generates one symbol for the frequency of the selected signal. Moreover, the modulation unit 103 selects any one of the signals 11 to 18 corresponding to [e, f, h] that corresponds to the processing result for the second cycle, and generates one symbol for the frequency of the selected signal.

The transmission processing unit 104 performs predetermined waveform shaping processing, digital/analog (DA) conversion processing, up-conversion processing, power amplification processing, and the like with use of a signal of the frequency selected by the modulation unit 103, and generates a high-frequency analog signal using a predetermined carrier frequency. The high-frequency analog signal is transmitted from the transmitting antenna 105.

Figure 4:
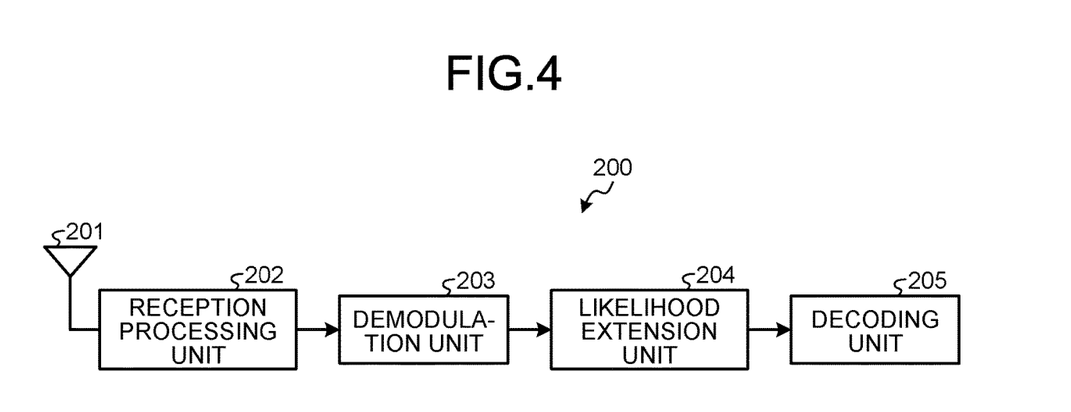
FIG. 4 is a diagram illustrating a configuration of a receiver according to the embodiment.

The operation of the receiver 200 will be described. FIG. 4 is a diagram illustrating a configuration of the receiver 200 according to the embodiment. The receiver 200 includes a receiving antenna 201, a reception processing unit or processor 202, a demodulation unit or demodulator 203, a likelihood extension unit or extender 204, and a decoding unit or decoder 205.

The receiving antenna 201 receives a signal transmitted by the transmitter 100. The reception processing unit 202 performs filter processing, down-conversion processing, analog/digital (AD) conversion processing, and the like on the received signal received by the receiving antenna 201, and converts the signal into a baseband signal. The reception processing unit 202 also outputs the baseband signal obtained by the conversion to the demodulation unit 203.

The demodulation unit 203 uses the received baseband signal to calculate two or more first reliabilities that are reliabilities of two or more bit sequences derivable from the symbol of the signal received by the receiver 200. For example, the demodulation unit 203 holds therein information on the same signals as the eight signals having different frequencies used in the modulation unit 103 and determines, as the reliabilities, correlative power values calculated by performing correlation processing on the baseband signal with each of the eight signals having different frequencies. Since the eight signals having different frequencies are orthogonal to one another, the correlative power value of the signal having the frequency corresponding to the frequency of the signal outputted by the modulation unit 103 is expected to be the largest among the eight correlative power values calculated by the demodulation unit 203, and the seven correlative power values not corresponding to the frequency of the signal outputted by the modulation unit 103 are expected to have small values close to noise. The demodulation unit 203 performs the processing on the baseband signal according to the number of symbols transmitted from the transmitter 100. The demodulation unit 203 outputs the calculated eight reliabilities per symbol to the likelihood extension unit 204. The eight reliabilities calculated by the demodulation unit 203 are also called a plurality of first reliabilities.

The likelihood extension unit 204 uses the plurality of first reliabilities to calculate a plurality of second reliabilities that is required when the decoding unit 205 performs processing of decoding a convolutional code. The details of the processing performed by the likelihood extension unit 204 and the decoding unit 205 will be described.

The decoding unit 205 performs the processing of decoding the convolutional code having the constraint length of three and the code rate of R=1/2 which have been used in coding by the coding unit 101. As described above, the bit erasing unit 102 has erased one bit from the first bit sequence. On the other hand, because the first reliability outputted by the demodulation unit 203 to the likelihood extension unit 204 is a reliability of the symbol that has been subjected to modulation using the second bit sequence obtained after erasing one bit, the decoding unit 205 cannot perform the decoding processing in consideration of the erased one bit even if the first reliability is used as is.

The decoding unit 205 calculates a least common multiple X between the first number of bits used by the bit erasing unit 102 when erasing bits from the first bit sequence, and the reciprocal 1/R of the code rate used by the coding unit 101. Moreover, the decoding unit 205 performs decoding using a trellis diagram constructed such that the number of bits of the coded bit sequence per branch matches the least common multiple X. In the case of the present embodiment, the first number of bits used by the bit erasing unit 102 is four, and the code rate used by the coding unit 101 is 1/2, thereby resulting in the least common multiple X being four. Accordingly, the decoding unit 205 constructs a trellis diagram such that the coded bit sequence per branch has four bits. The coded bit sequence per branch is also called an extended bit sequence. The decoding unit 205 can generate the information bits used by the coding unit 101 by performing Viterbi decoding using the constructed trellis diagram.

Figure 5:
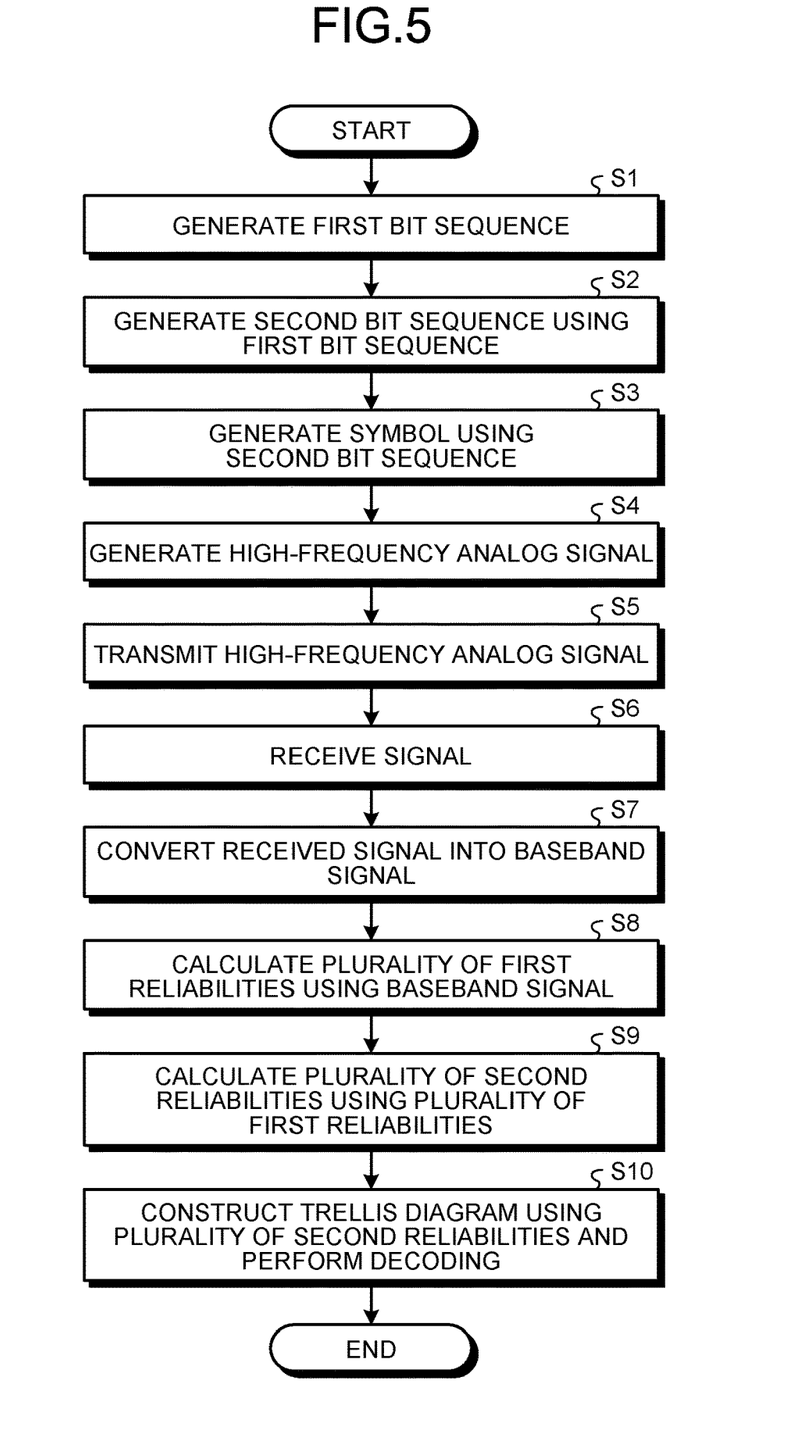
FIG. 5 is a flowchart illustrating a series of processings in the wireless communication system according to the embodiment.

FIG. 5 is a flowchart illustrating a series of processings performed by the wireless communication system 1 according to the embodiment. The coding unit 101 generates a first bit sequence by performing convolutional coding on information bits on the basis of a predetermined code rate (step S1). The bit erasing unit 102 uses the first bit sequence to generate a second bit sequence by erasing one or more bits for every consecutive first number of bits that is determined in advance, and outputs the second bit sequence to the modulation unit 103 (step S2). The modulation unit 103 uses the second bit sequence to perform modulation processing using orthogonal signals, and generates a symbol (step S3). The transmission processing unit 104 generates a high-frequency analog signal using the symbol (step S4). The transmitting antenna 105 transmits the high-frequency analog signal to the receiving antenna 201 (step S5). The receiving antenna 201 receives the signal transmitted by the transmitting antenna 105 (step S6). The reception processing unit 202 converts the received signal into a baseband signal (step S7). The demodulation unit 203 calculates a plurality of first reliabilities using the baseband signal (step S8). The likelihood extension unit 204 calculates a plurality of second reliabilities using the plurality of first reliabilities (step S9). The decoding unit 205 constructs a trellis diagram using the plurality of second reliabilities, and performs decoding using Viterbi decoding (step S10).

A hardware configuration of the wireless communication system 1 will be described. The coding unit 101, the bit erasing unit 102, the modulation unit 103, the transmission processing unit 104, the reception processing unit 202, the demodulation unit 203, the likelihood extension unit 204, and the decoding unit 205 are implemented by a processing circuit that is an electronic circuit configured to perform the processings.

Figure 6:
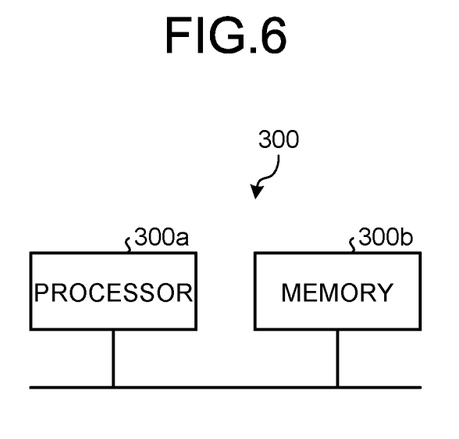
FIG. 6 is a diagram illustrating a control circuit according to the embodiment.

The processing circuit may be dedicated hardware, or a control circuit including a memory and a CPU (central processing unit or central arithmetic device) that executes a program stored in the memory. The memory in this case corresponds to, for example, a non-volatile or volatile semiconductor memory such as a random access memory (RAM), a read only memory (ROM), or a flash memory, a magnetic disk, an optical disk, or the like. FIG. 6 is a diagram illustrating the control circuit according to the embodiment. When the processing circuit is the control circuit including the CPU, the control circuit corresponds to a control circuit 300 configured as shown in FIG. 6, for example.

As illustrated in FIG. 6, the control circuit 300 includes a processor 300a that is the CPU and a memory 300b. When implemented by the control circuit 300 illustrated in FIG. 6, the implementation is realized by the processor 300a reading and executing a program corresponding to each processing stored in the memory 300b. The memory 300b is also used as a temporary memory for each processing executed by the processor 300a.

Figure 7:
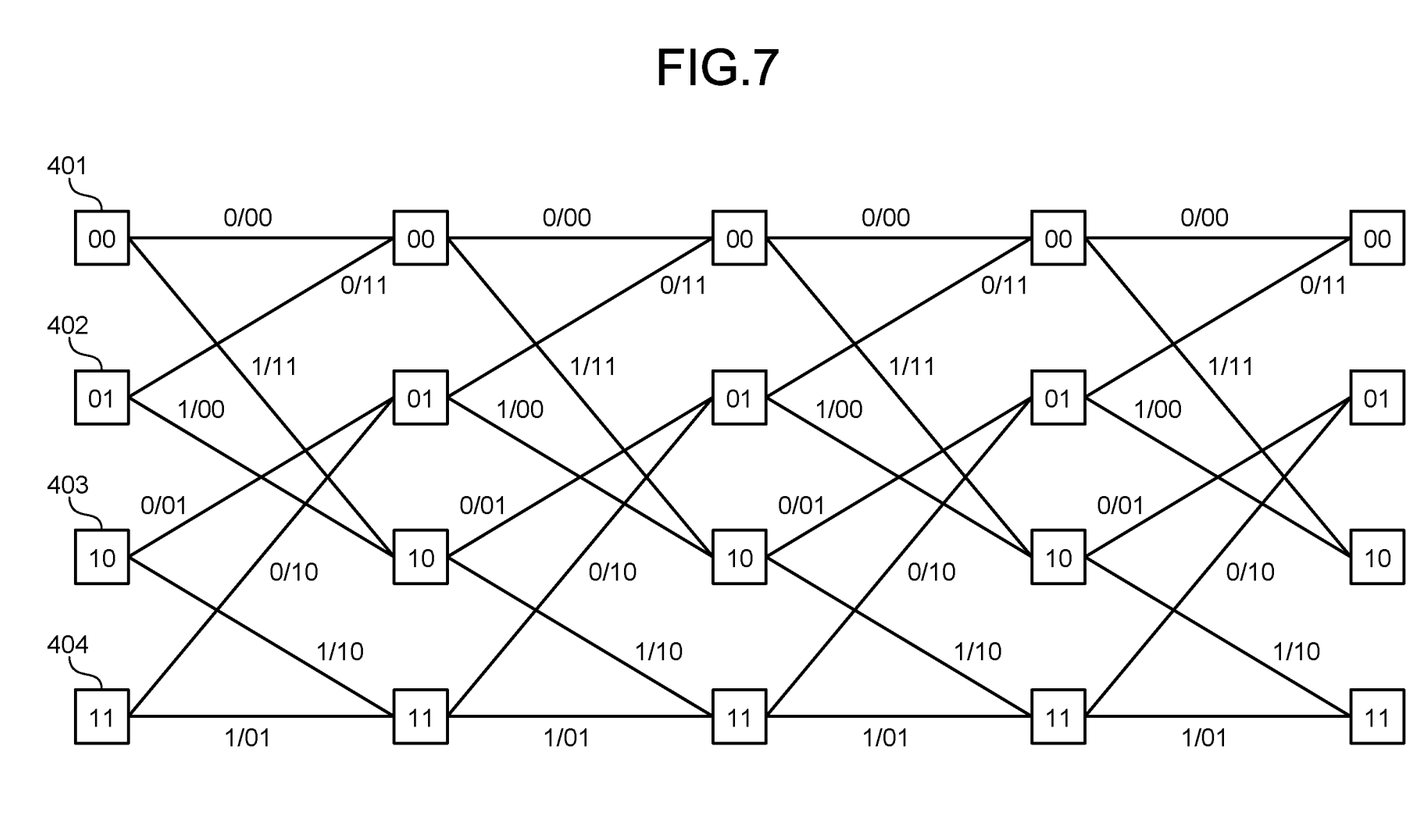
FIG. 7 is a diagram illustrating typical trellis lines with a constraint length of three and a code rate of R=1/2.

FIG. 7 is a diagram illustrating typical trellis lines with the constraint length of three and the code rate of R=1/2. FIG. 7 illustrates a typical trellis diagram corresponding to four state transitions. State numbers 401 to 404 in FIG. 7 refer to state numbers "00", "01", "10", and "11" in the trellis diagram, respectively. Note that numerical values of 0 or 1 attached to branches in FIG. 7 each represent the association between the information bit and the coded bit sequence. For example, the branch labeled "0/00" represents that a bit "0" is inputted to the coding unit 101 as the information bit, and two bits having bits "00" are outputted from the coding unit 101 as the first bit sequence. Note that the trellis diagram of FIG. 7 is used to give description of a typical trellis diagram and is not a trellis diagram used by the decoding unit 205.

Figure 8:
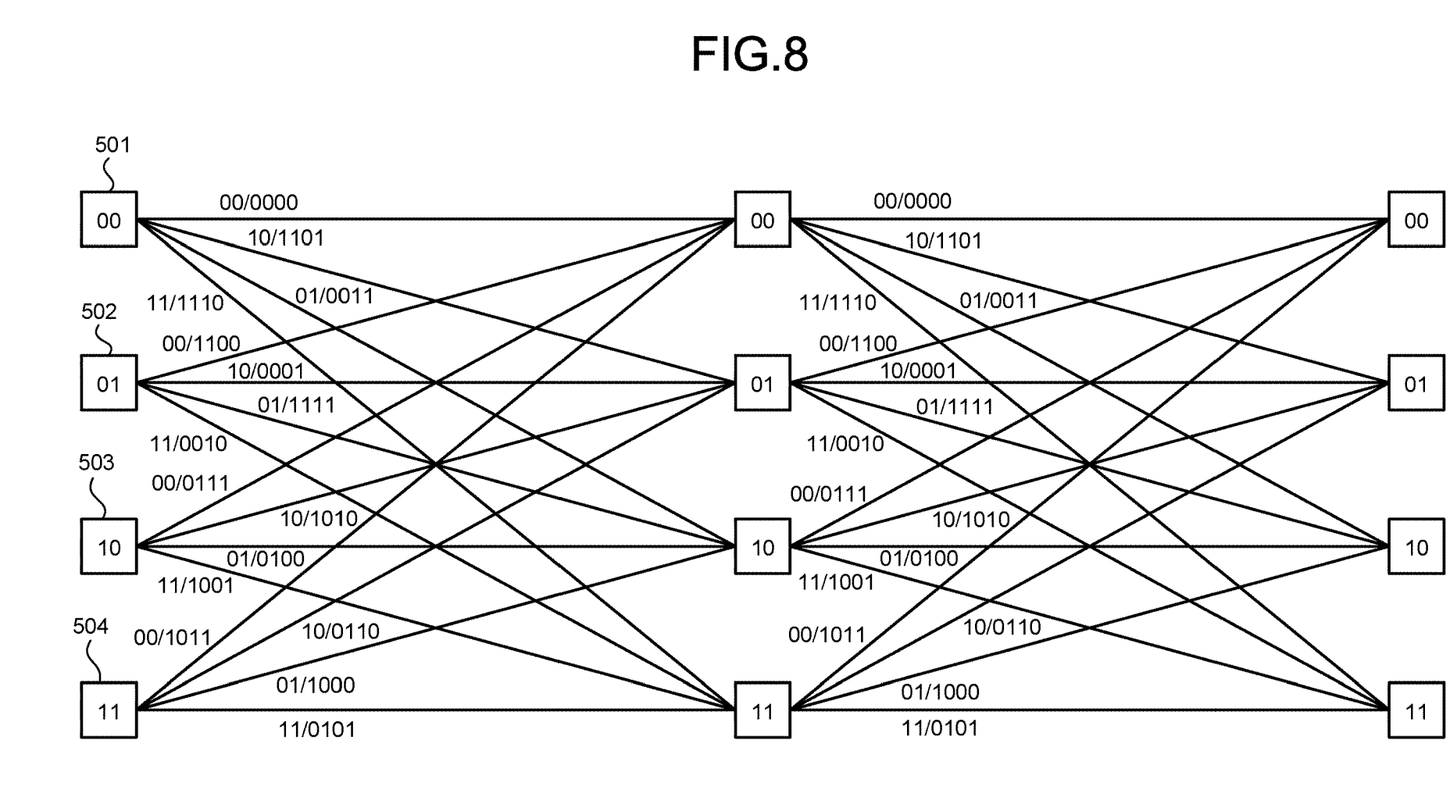
FIG. 8 is a diagram illustrating trellis lines used by a decoding unit according to the embodiment.

FIG. 8 is a diagram illustrating trellis lines used by the decoding unit 205 according to the embodiment. FIG. 8 corresponds to a figure obtained by putting two state transitions in FIG. 7 into one. In FIG. 8, state numbers are attached only to the left end of the figure. The decoding processing performed by the decoding unit 205 is performed by state transitions from the left end to the right end of FIG. 8 along branches connecting the state numbers. In FIG. 8, state numbers 501 to 504 refer to state numbers in the trellis diagram similarly to FIG. 7. Therefore, in FIG. 7, one bit for the information bit and two bits for the coded bits are assigned to each branch per state transition, whereas in FIG. 8, two bits for the information bits and four bits for the coded bits are assigned to each branch per state transition. That is, FIG. 8 is a trellis diagram constructed such that the number of bits of the coded bit sequence per branch matches the least common multiple X used by the decoding unit 205.

As illustrated in the trellis diagram of FIG. 8, it can be seen that the decoding unit 205 needs reliabilities for the coded bit sequence of four bits per state transition. That is, the decoding unit 205 needs 16 reliabilities for one state transition. In another respect, the demodulation unit 203 can output only eight reliabilities corresponding to a symbol that is modulated after one bit is erased by the bit erasing unit 102. The likelihood extension unit 204 performs processing of generating 16 second reliabilities required by the decoding unit 205 as follows with use of the eight first reliabilities outputted by the demodulation unit 203.

The likelihood extension unit 204 generates the 16 second reliabilities using the second bit sequence and the eight first reliabilities. A description will be made using, as an example, the case described above in which the coding unit 101 generates the first bit sequence [a, b, c, d, e, f, g, h] having eight bits, and the bit erasing unit 102 generates the second bit sequence of [a, b, d, e, f, h] by periodically erasing one bit from four bits that is the first bit sequence.

The second bit sequence [a, b, d, e, f, h] outputted by the bit erasing unit 102 is converted into two symbols corresponding to three bits of [a, b, d] and three bits of [e, f, h] by the modulation unit 103. For this example, the demodulation unit 203 calculates eight first reliabilities for each of the symbol generated on the basis of [a, b, d] and the symbol generated on the basis of [e, f, h]. That is, at the time the demodulation unit 203 outputs eight patterns of first reliabilities to the likelihood extension unit 204, the reliabilities corresponding to only three bits of the symbol, of four bits of the coded bit sequence have been obtained, the four bits being the first number of bits used by the bit erasing unit 102.

The likelihood extension unit 204 duplicates the plurality of first reliabilities. The likelihood extension unit 204 further generates a plurality of extended bit sequences each being a bit sequence composed of the first number of bits, and generates a plurality of second reliabilities that is reliabilities of the extended bit sequences by assigning the duplicated first reliabilities to the extended bit sequences, respectively. With the first number of bits being four and the extended bit sequence being [a, b, c, d], for example, the likelihood extension unit 204 assigns a first reliability of [a, b, d]=[0, 0, 0] of the first reliabilities as a reliability of each of [a, b, c, d]=[0, 0, 0, 0] and [a, b, c, d]=[0, 0, 1, 0], thereby to generate the second reliability and output the second reliability to the decoding unit 205.

Figure 9:
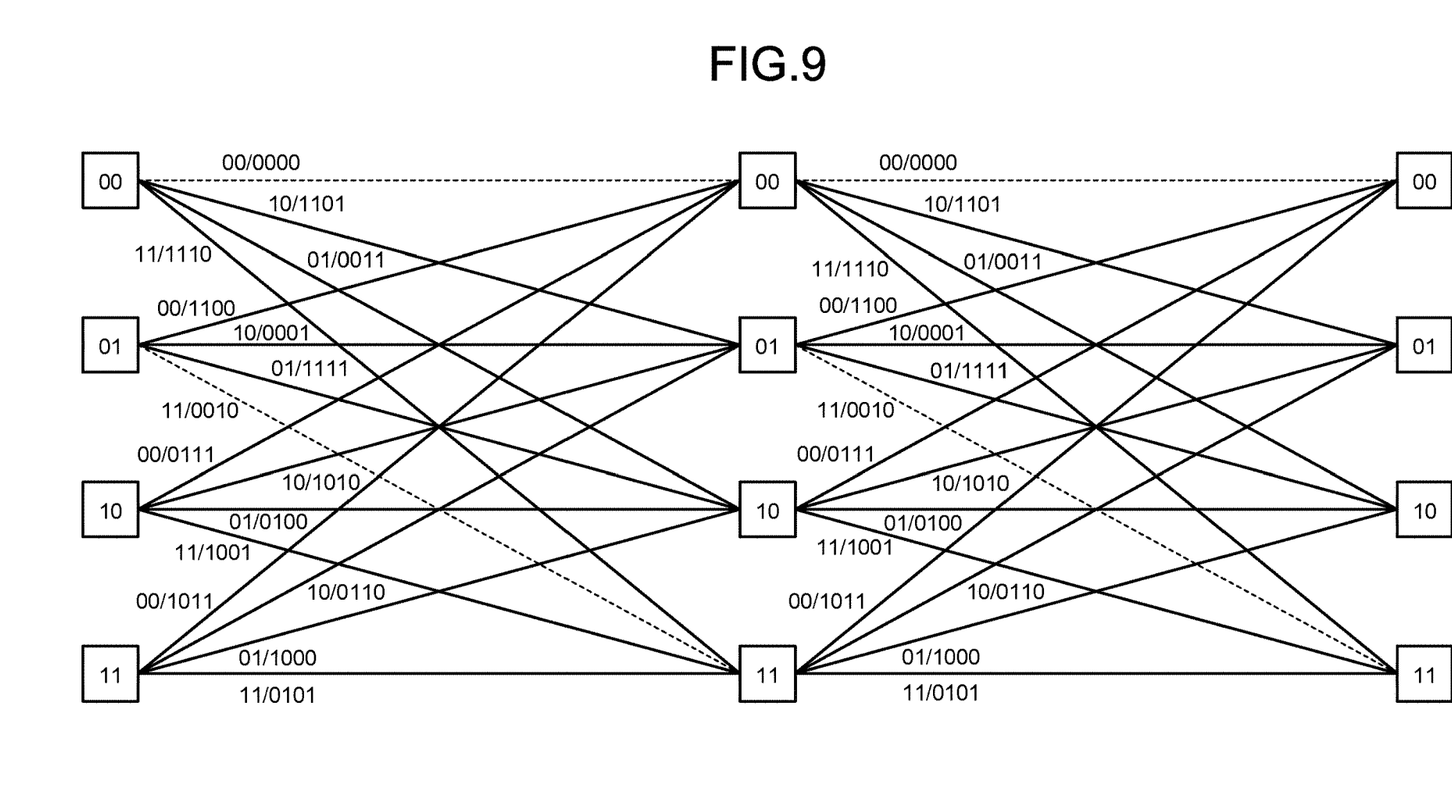
FIG. 9 is a diagram illustrating trellis lines when a likelihood extension unit according to the embodiment applies processing of duplicating a first reliability.

FIG. 9 is a diagram illustrating trellis lines when the likelihood extension unit 204 according to the embodiment applies the processing of duplicating the first reliability. In FIG. 9, two branches indicated by broken lines for one state transition represent branches for which the reliability for [a, b, d]=[0, 0, 0] calculated by the demodulation unit 203 is duplicated.

The decoding unit 205 creates a trellis diagram using the code rate R and the plurality of extended bit sequences, assigns 16 patterns of second reliabilities to the corresponding branches, respectively, performs the decoding processing by implementing a Viterbi algorithm, and generates the information bits used by the coding unit 101.

Figure 10:
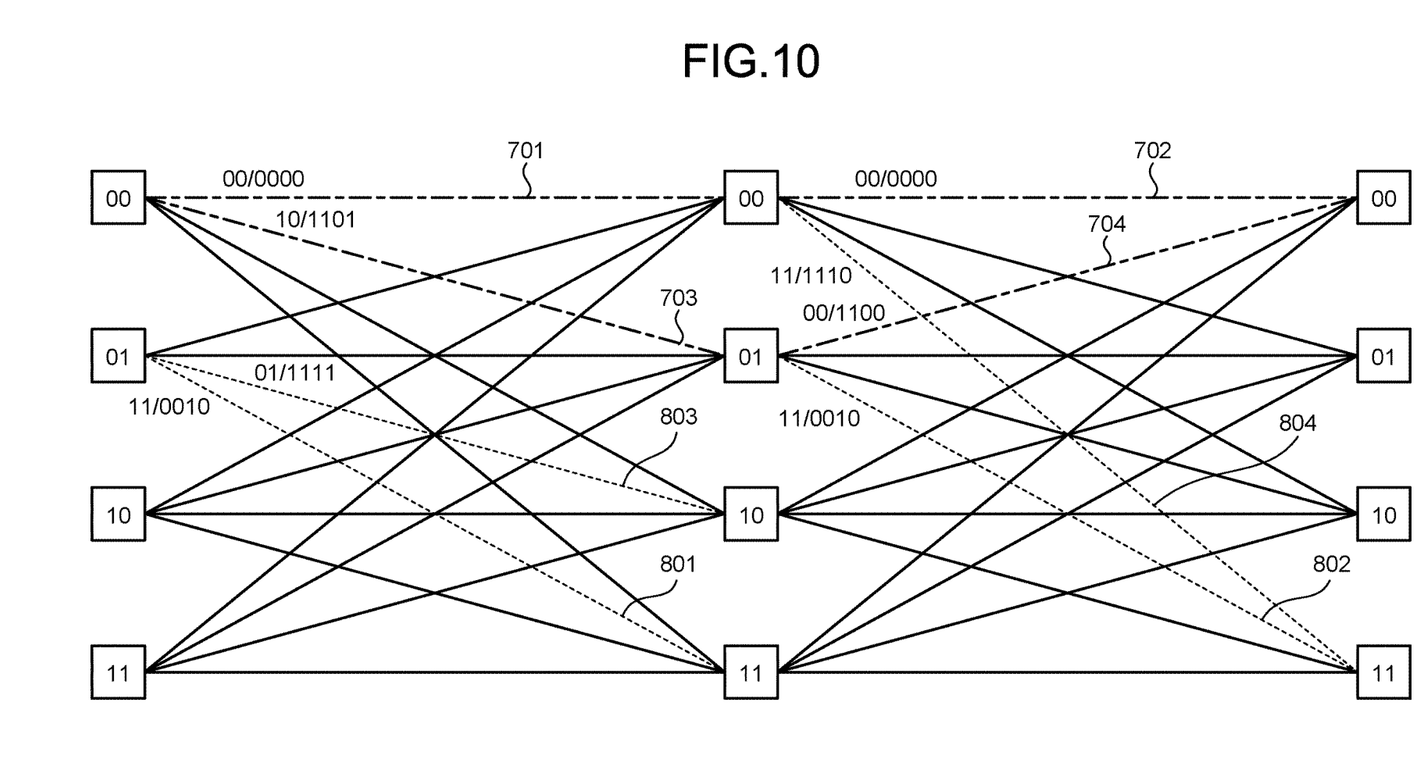
FIG. 10 is a diagram representing two paths that merge in the shortest manner with respect to the trellis diagram of FIG. 8, the two paths being represented by dot-dashed lines.

Characteristics of the disclosure according to the present embodiment will be described in detail. One factor that influences a performance in decoding of the convolutional code is exemplified by a relationship between paths to be merged on the trellis diagram. FIG. 10 is a diagram indicating two paths to be merged in the shortest manner with respect to the trellis diagram of FIG. 8, the two paths being shown by dot-dashed lines. In FIG. 10, branches 701 and 702 represent branches that each form one of the two paths to be merged in the shortest manner (hereinafter referred to as path A). Branches 703 and 704 represent branches that each form the other one of the two paths to be merged in the shortest manner (hereinafter referred to as path B). FIG. 10 also shows that branches having the same reliabilities as the branches 701 to 704 are branches 801 to 804 which are indicated by broken lines. The branch having the same reliability as the branch 701 is the branch 801. Similarly, the branches having the same reliabilities as the branches 702 to 704 are the branches 802 to 804, respectively.

The paths A and B have transition such that they start from the state number 00 at the left end, go through two state transitions, and then merge at the state number 00 again. Therefore, the paths A and B are one combination of paths that is prone to some decoding error. In the Viterbi algorithm, the reliability of the path A is calculated as a sum of the reliability of the branch 701 corresponding to the coded bit sequence 0000 and the reliability of the branch 702 corresponding to the coded bit sequence 0000. Also, the reliability of the path B is calculated as a sum of the reliability of the branch 703 corresponding to the coded bit sequence 1101 and the reliability of the branch 704 corresponding to the coded bit sequence 1100. In another respect, in the present embodiment, the likelihood extension unit 204 performs the processing of generating 16 patterns of reliabilities by duplicating the eight reliabilities calculated by the demodulation unit 203. That is, the likelihood extension unit 204 generates the second reliabilities using the first reliabilities. For this reason, the decoding unit 205 cannot determine a certainty between the branches to which the same reliability is assigned, and there is a possibility that the decoding error increases as compared to a decoding method that does not duplicate reliabilities.

However, the branches 801 to 804 indicated by the broken lines in FIG. 10 to which the same reliabilities as those assigned as the branches 701 to 704 are assigned are all assigned to branches forming completely different state transitions that are not involved in discrimination between the path A and the path B. This means that the processing performed by the likelihood extension unit 204 does not affect the decoding error between the path A and the path B that merge in the shortest manner. Which branch in the trellis diagram the second reliability duplicated by the likelihood extension unit 204 is assigned to depends on the structure of an error correction code used by the coding unit 101 and a bit erasing pattern used by the bit erasing unit 102. In the present embodiment, the coding unit 101 uses a convolutional code as the error correction code, so leading to a structure of the error correction code with being involved in discrimination of error-prone paths such as the path A and the path B. That is, it can be seen that the use of the method of constructing the trellis diagram in the present embodiment can prevent a decline in the decoding performance caused by bit erasing performed by the bit erasing unit 102.

Note that the present embodiment has illustrated the case where the bit erasing unit 102 erases one bit every four bits to achieve the code rate of V=2/3, but the present disclosure is not limited to such a case. For example, the present disclosure can be applied even in the case where the code rate of V=3/4 is achieved by erasing two bits every six bits. In this case, for example, it is conceivable that the bit erasing unit 102 erases two bits [d, e] from the output [a, b, c, d, e, f] of the coding unit 101 and outputs the bits of [a, b, c, f]. The modulation unit 103 constructs a symbol using 16FSK in which four bits form one symbol. The demodulation unit 203 calculates 16 patterns of reliabilities complying with 16FSK, and the likelihood extension unit 204 calculates 64 patterns of reliabilities from the 16 patterns of reliabilities and outputs the calculated reliabilities to the decoding unit 205. The decoding unit 205 obtains the least common multiple, X=6 between 6 that is the first number of bits used in the bit erasing unit 102 and 3/2 that is the reciprocal of the code rate used in the coding unit 101, and performs decoding using a trellis diagram constructed such that the number of bits of the coded bit sequence per branch is six which so as to match the least common multiple.

Furthermore, in the present embodiment, the modulation unit 103 is configured such that the first number of bits used in the bit erasing unit 102 is made equal to the number of bits per symbol, but the present disclosure is not limited to this example, and these values need not to be equal as long as the first number of bits used in the bit erasing unit 102 is a multiple of the number of bits per symbol. For example, the modulation unit 103 may form a symbol of six bits for two cycles in 64FSK instead of forming the three-bit output bit in 8FSK as illustrated in the present embodiment. In this case, the decoding unit 205 need only perform decoding using a trellis diagram constructed such that the number of bits of the coded bit sequence per branch is eight. The demodulation unit 203 in this case calculates 64 patterns of reliabilities. The likelihood extension unit 204 calculates 256 patterns of reliabilities on the basis of the 64 reliabilities and outputs them to the decoding unit 205.

Moreover, the present embodiment has a configuration using FSK as the modulation system of the modulation unit 103, but the present disclosure is not limited to this example, and as long as a system can calculate the reliability symbol by symbol, the present disclosure is not limited to FSK. The present disclosure is preferably applied to a system of generating a modulated signal on the basis of orthogonal signals in FSK, M-ary transmission system, or the like in which it is particularly difficult to accurately calculate the reliability per bit. As to the system of generating a modulated signal, for example, a case will be described in which the M-ary transmission system (M=8) using an Hadamard sequence having a length of eight is applied instead of 8FSK used in description for the present embodiment. When the M-ary transmission system is applied, the modulation unit 103 generates a symbol with use of eight orthogonal sequences generated from an Hadamard matrix instead of eight signals that have their respective different frequencies and are orthogonal to one another. Moreover, as in the case of using 8FSK, the modulation unit 103 determines in advance the association between the second bit sequences and the eight orthogonal sequences, and selects and outputs an orthogonal sequence according to the second bit sequence inputted therein. The demodulation unit 203 holds the same eight orthogonal sequences as the ones used in the modulation unit 103, and calculates correlative power values by performing correlation processing on the baseband signal with each of the eight orthogonal sequences. Furthermore, as in the case of 8FSK, the demodulation unit 203 outputs the correlative power values as reliabilities. The rest of the processing is similar to that of the present embodiment.

Moreover, in the present embodiment, the decoding unit 205 obtains the least common multiple X of the first number of bits used in the bit erasing unit 102 and the reciprocal 1/R of the code rate used in the coding unit 101, and constructs the trellis diagram with branches in which the number of bits per branch is equal to the least common multiple X, but a similar effect can be yielded even if the decoding unit 205 constructs the trellis diagram in which the number of bits per branch is equal to a common multiple other than the least common multiple X.

Furthermore, in the present embodiment, the demodulation unit 203 is configured to use the correlative power value between the baseband signal and the frequency signal as the method of generating the first reliability, but the present disclosure is not limited to this example. For example, the demodulation unit 203 may calculate a complex correlation value between the baseband signal and the frequency signal, and output a real number component of the calculated complex correlation value as the first reliability. The processing of calculating the first reliability using the complex correlation value corresponds to synchronous detection FSK processing, which can generate a reliability that is more robust to noise than the case of using the correlative power value.

As described above, in the present embodiment, the bit erasing unit 102 erases at least one bit from the first bit sequence in accordance with the first number of bits determined in advance, and generates the second bit sequence. The modulation unit 103 generates the symbol using the second bit sequence. The demodulation unit 203 calculates the first reliability for the symbol outputted by the modulation unit 103. The likelihood extension unit 204 uses the first reliability to generate the second reliability to be used by the decoding unit 205 in the decoding processing. The decoding unit 205 constructs a trellis diagram in which the number of bits of the coded bit sequence per branch is equal to the least common multiple X with use of the second reliability, and performs the decoding processing on the convolutional code using the resultant trellis diagram. As a result, even when the transmitter 100 performs coding at a code rate of which the reciprocal is not a natural number, such as the code rate of V=2/3, the receiver 200 can perform decoding using the reliability calculated symbol by symbol. Therefore, the receiver 200 can flexibly set the transmission speed.

The present disclosure can achieve and advantageous effect in that the wireless communication system capable of setting the transmission speed flexibly can be provided.

The configurations illustrated in the above embodiment merely illustrates examples of the content of the present disclosure, and can thus each be combined with other publicly known techniques and partially omitted and/or modified without departing from the scope of the present disclosure.

What is claimed is:

1. A wireless communication system comprising:
   a transmitter comprising:
      a coder to generate a first bit sequence by performing convolutional coding on an information bit on the basis of a code rate;
      a bit eraser to generate a second bit sequence by erasing one or more bits from the first bit sequence for every predetermined first number of bits; and
      a modulator to generate a symbol by modulation using the second bit sequence; and
   a receiver comprising:
      a demodulator to calculate a plurality of first reliabilities that are reliabilities of a plurality of bit sequences that can be derived from the symbol;
      a likelihood extender to generate a plurality of extended bit sequences that are bit sequences each composed of bits for the first number of bits, and generate a plurality of second reliabilities that are reliabilities of the plurality of extended bit sequences by assigning a plurality of first reliabilities duplicated, as the reliabilities of the plurality of extended bit sequences; and
      a decoder to create a trellis diagram using the code rate and the plurality of extended bit sequences, and perform decoding by assigning the plurality of second reliabilities to a plurality of branches of the trellis diagram.

2. The wireless communication system according to claim 1, wherein
   the number of bits of the branch is equal to a common multiple of a reciprocal of the code rate and the first number of bits.

3. The wireless communication system according to claim 2, wherein
   the number of bits of the branch is equal to a least common multiple of the reciprocal of the code rate and the first number of bits.

4. The wireless communication system according to claim 1, wherein
   the number of bits of the symbol is equal to a multiple of the first number of bits.

5. The wireless communication system according to claim 2, wherein
   the number of bits of the symbol is equal to a multiple of the first number of bits.

6. The wireless communication system according to claim 3, wherein
   the number of bits of the symbol is equal to a multiple of the first number of bits.

7. The wireless communication system according to claim 1, wherein
   the number of bits of the symbol is equal to the first number of bits.

8. The wireless communication system according to claim 2, wherein
   the number of bits of the symbol is equal to the first number of bits.

9. The wireless communication system according to claim 3, wherein
   the number of bits of the symbol is equal to the first number of bits.

10. A wireless communication device comprising:
    a transmitter comprising:
       a coder to generate a first bit sequence by performing convolutional coding on an information bit on the basis of a code rate;
       a bit eraser to generate a second bit sequence by erasing one or more bits from the first bit sequence for every predetermined first number of bits; and
       a modulator to generate a symbol by modulation using the second bit sequence; and
    a receiver comprising:
       a demodulator to calculate a plurality of first reliabilities that are reliabilities of a plurality of bit sequences that can be derived from the symbol;
       a likelihood extender to generate a plurality of extended bit sequences that are bit sequences each composed of bits for the first number of bits, and generate a plurality of second reliabilities that are reliabilities of the plurality of extended bit sequences by assigning a plurality of first reliabilities duplicated, as the reliabilities of the plurality of extended bit sequences; and
       a decoder to create a trellis diagram using the code rate and the plurality of extended bit sequences, and perform decoding by assigning the plurality of second reliabilities to a plurality of branches of the trellis diagram.

11. A receiver comprising:
    a demodulator to calculate a plurality of first reliabilities that are reliabilities of a plurality of bit sequences that can be derived from the symbol transmitted by a transmitter including a coder to generate a first bit sequence by performing convolutional coding on an information bit on the basis of a code rate, a bit eraser to generate a second bit sequence by erasing one or more bits from the first bit sequence for every predetermined first number of bits, and a modulator to generate a transmission symbol by modulation using the second bit sequence;
    a likelihood extender to generate a plurality of extended bit sequences that are bit sequences each composed of bits for a predetermined number of bits, and generate a plurality of second reliabilities that are reliabilities of the plurality of extended bit sequences by assigning a plurality of first reliabilities duplicated, as the reliabilities of the plurality of extended bit sequences; and a decoder to create a trellis diagram using the plurality of extended bit sequences, and perform decoding by assigning the plurality of second reliabilities to a plurality of branches of the trellis diagram.

12. A control circuit by which a transmitter and a receiver are controlled, the control circuit causing the transmitter to implement:
- a first step of generating a first bit sequence by performing convolutional coding on an information bit on the basis of a code rate;
- a second step of generating a second bit sequence by erasing one or more bits from the first bit sequence for every predetermined first number of bits; and
- a third step of generating a symbol by modulation using the second bit sequence, and the control circuit causing the receiver to implement:
- a fourth step of calculating a plurality of first reliabilities that are reliabilities of a plurality of bit sequences that can be derived from the symbol;
- a fifth step of generating a plurality of extended bit sequences that are bit sequences each composed of bits for the first number of bits, and generating a plurality of second reliabilities that are reliabilities of the plurality of extended bit sequences by assigning a plurality of first reliabilities duplicated, as the reliabilities of the plurality of extended bit sequences; and
- a sixth step of creating a trellis diagram using the code rate and the plurality of extended bit sequences, and performing decoding by assigning the plurality of second reliabilities to a plurality of branches of the trellis diagram.

13. A non-transitory storage medium in which a program is stored, the program being configured to control a transmitter and a receiver, the program causing the transmitter to implement:
- a first step of generating a first bit sequence by performing convolutional coding on an information bit on the basis of a code rate;
- a second step of generating a second bit sequence by erasing one or more bits from the first bit sequence for every predetermined first number of bits; and
- a third step of generating a symbol by modulation using the second bit sequence, and the program causing the receiver to implement:
- a fourth step of calculating a plurality of first reliabilities that are reliabilities of a plurality of bit sequences that can be derived from the symbol;
- a fifth step of generating a plurality of extended bit sequences that are bit sequences each composed of bits for the first number of bits, and generating a plurality of second reliabilities that are reliabilities of the plurality of extended bit sequences by assigning a plurality of first reliabilities duplicated, as the reliabilities of the plurality of extended bit sequences; and
- a sixth step of creating a trellis diagram using the code rate and the plurality of extended bit sequences, and performing decoding by assigning the plurality of second reliabilities to a plurality of branches of the trellis diagram.

\* \* \* \* \*